United States Patent [19]

Hirose et al.

[11] Patent Number: 5,039,548

[45] Date of Patent: Aug. 13, 1991

[54] PLASMA CHEMICAL VAPOR REACTION METHOD EMPLOYING CYCLOTRON RESONANCE

[75] Inventors: Naoki Hirose; Takashi Inushima, both of Atsugi, Japan

[73] Assignee: Semiconductor Energy Laboratory Co., Ltd., Atsugi, Japan

[21] Appl. No.: 299,014

[22] Filed: Jan. 19, 1989

[30] Foreign Application Priority Data

Jan. 27, 1988 [JP] Japan .................. 63-18145

[51] Int. Cl.⁵ .................. C23C 16/26; C23C 16/50
[52] U.S. Cl. .................. 427/45.1; 427/37; 427/47
[58] Field of Search .................. 118/723, 728, 729; 427/45.1, 37, 47

[56] References Cited

U.S. PATENT DOCUMENTS

| | | | |
|---|---|---|---|
| 4,125,431 | 11/1978 | Fowler | 176/3 |
| 4,582,720 | 4/1986 | Yamazaki | 427/38 |
| 4,724,058 | 2/1988 | Morrison, Jr. | 118/723 |
| 4,745,337 | 5/1988 | Pichot et al. | 118/723 |
| 4,926,791 | 5/1990 | Hicose et al. | 118/723 |

FOREIGN PATENT DOCUMENTS 62-103370 1/1987 Japan .

OTHER PUBLICATIONS

Kauarada et al, Japanese Journal of Applied Physics, vol. 26, No. 6, Jun. 1987, pp. L1032-L1034.

*Primary Examiner*—Michael Lusignan
*Assistant Examiner*—Margaret Burke
*Attorney, Agent, or Firm*—Sixbey, Friedman, Leedom & Ferguson

[57] ABSTRACT

An improved plasma chemical vapor reaction apparatus is described. The apparatus comprises a reaction chamber, a gas feeding system for introducing a reactive gas into the reaction chamber, Helmholtz coils for inducing a magnetic field in the reaction chamber, a microwave generator for inputting microwaves into the reaction chamber, a substrate holder for supporting a substrate to be treated in the reaction chamber. The substrate holder is located with respect to said magnetic field inducing means in order that the graduent vector of the strength of the magnetic field induced by the Helmoholts coils is directed toward the substrate in the vicinity of the surface of the substrate to be treated. By virtue of the magnetic field caracterized by such a gradient vector, the plasma gas in the reaction chamber is drifted toward the substrate.

5 Claims, 6 Drawing Sheets

PLASMA CHEMICAL VAPOR REACTION METHOD EMPLOYING CYCLOTRON RESONANCE

BACKGROUND OF THE INVENTION

The present invention relates to a plasma chemical vapor reaction apparatus, and particularly, though not exclusively, relates to a plasma ECR CVD.

The ECR CVD has attracted the interest of researchers due to its high rate excitation ability. This deposition method makes use of ECR (Electron Cyclotron Resonance) which takes place between charged particles and microwaves in a magnetic field. Since the energy induced by ECR is very high, a substrate to be treated tends to suffer from sputtering damage. Substrates have been therefore located apart from the position in which ECR conditions of the magnetic field and the microwaves are satisfied.

However, in the prior art ECR CVD technique, the pressure of the reactive gas was on the order of $10^{-4}$ Torr in order to enable the excited gas to reach the substrate to be processed, and high crystallized deposition, such as diamond, can not be formed.

SUMMARY OF THE INVENTION

It is an object of the present invention to provide a plasma chemical vapor reaction apparatus capable of effective treatment of a substrate.

It is another object of the present invention to provide a plasma chemical vapor reaction apparatus capable of depositing highly crystallized films on substrates.

DETAILED DESCRIPTION OF THE PREFERRED EMBODIMENTS

Figure 1:
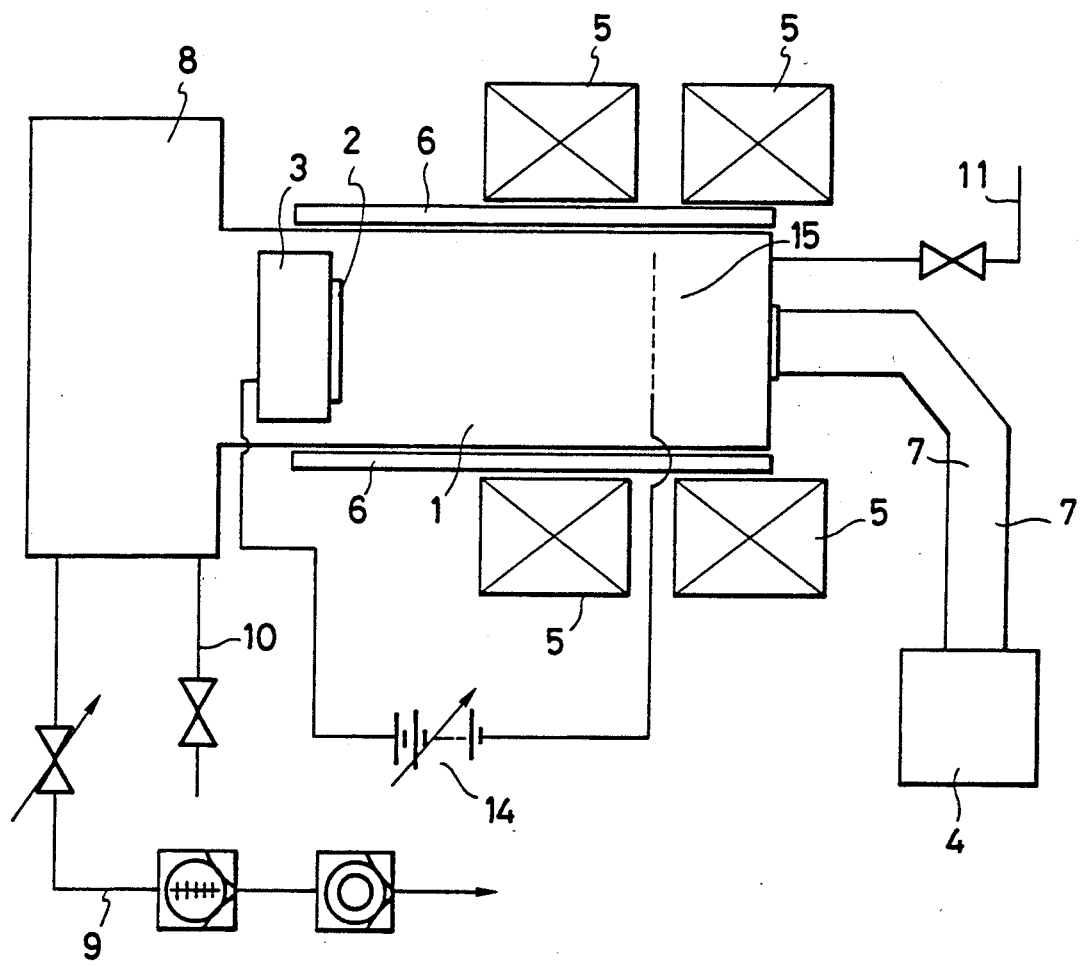
FIG. 1 is a schematic view showing a plasma CVD apparatus in accordance with the present invention.
Figure 2A:
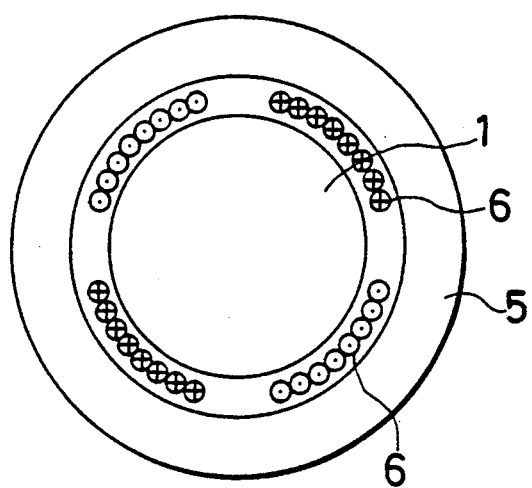
FIGS. 2(A) and 2(B) are cross sectional and plan views showing Ioffe bars comprising electromagnetics.
Figure 2B:
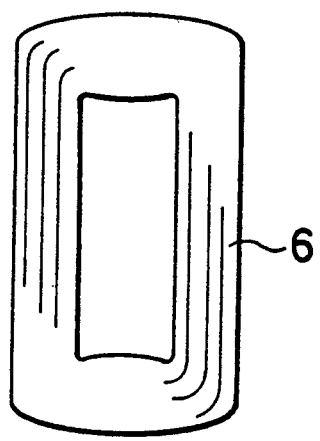
Figure 3A:
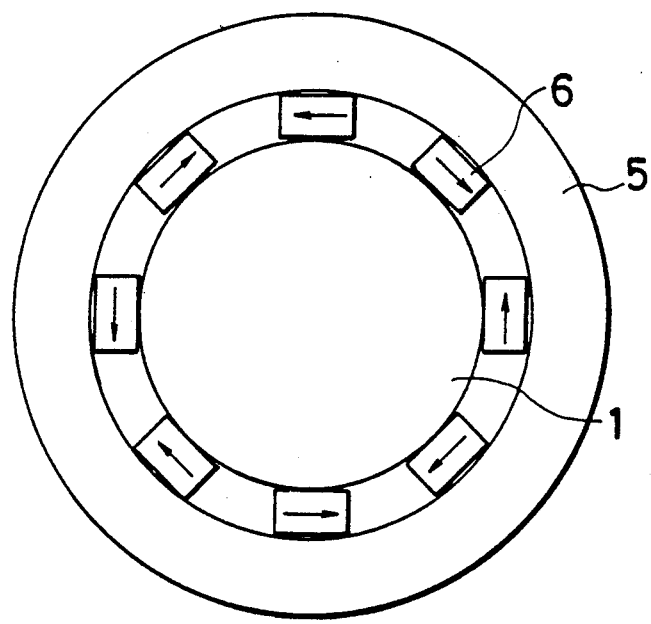
FIGS. 3(A) and 3(B) are cross sectional and plan views showing Ioffe bars comprising permanent magnets.
Figure 3B:
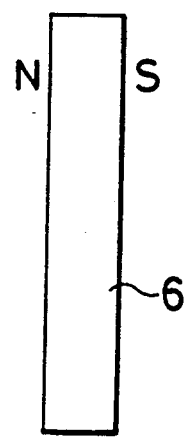
Figure 4:
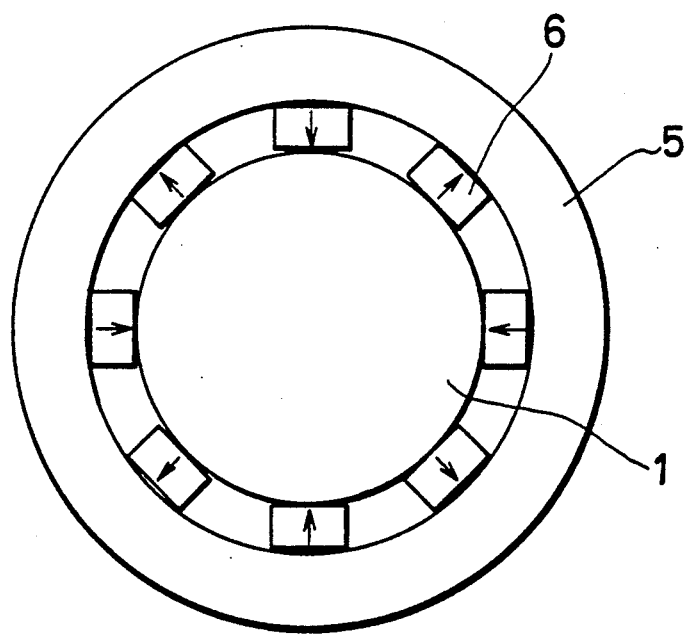
FIG. 4 is a cross sectional view showing a modification of the Ioffe bars illustrated in FIGS. 3(A) and 3(B)

Referring now to FIG. 1, an exemplary microwave enhanced plasma CVD apparatus in accordance with the present invention is illustrated. The apparatus comprises a reaction chamber in which a plasma generating space 1 and an auxiliary space 8 are defined which can be maintained at an appropriate negative pressure by means of an evacuating system 9. Gas introduction system 11 and 10 are connected to the plasma generating space 1 and the auxiliary space 8 respectively. Microwaves are introduced into the plasma generating space 1 from a microwave generator 1 through a wave guide 7. Helmhortz coils 5 and Ioffe bars 6 are located surrounding the plasma generating space 1. The Ioffe bars 6 are arranged along the microwave propagation direction and depicted in FIGS. 2(A) and 2(B) in case constructed with electromagnets and FIGS. 3(A) and 3(B) in case with permanent magnets. In FIGS. 3(A) and 3(B), arrows indicate the magnetic moments of the permanent magnets. FIG. 4 shows a modification of the Ioffe bars illustrated in FIGS. 3(A) and 3(B). A substrate 2 to be treated is mounted on a substrate holder 3 which is adapted to heat the substrate 2. The substrate holder 3 is made of a ceramic, e.g. aluminum nitride, which less disturbs the magnetic field induced by the magnets 5 and 6.

Figure 5:
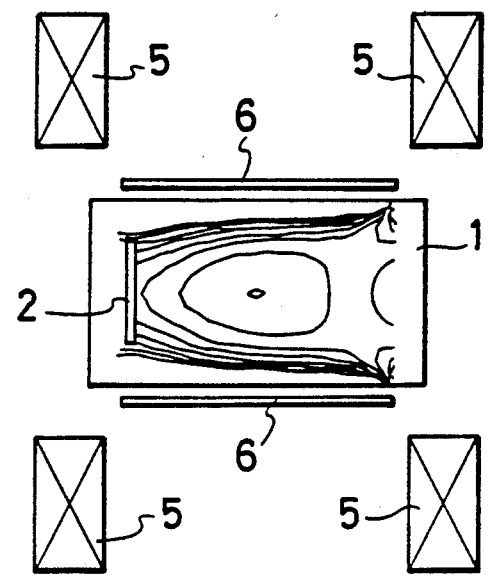
FIG. 5 is a schematic illustration showing the magnetic field strength profile in a plasma generating space in accordance with a prior art ECR CVD apparatus.
Figure 6:
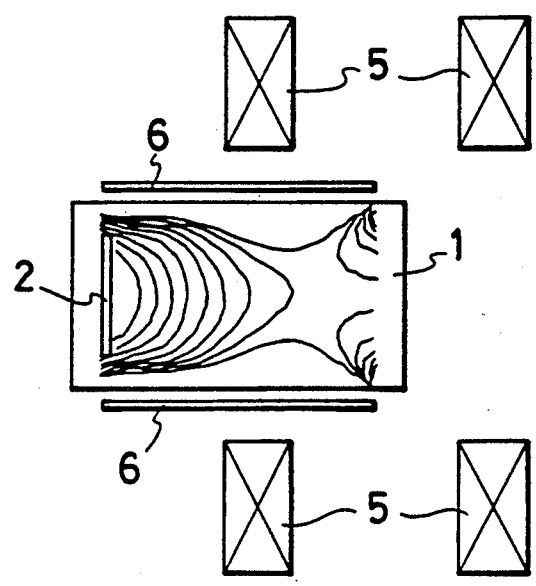
FIG. 6 is a schematic illustration showing the magnetic field strength in a plasma generating space in accordance with the present invention.
Figure 7:
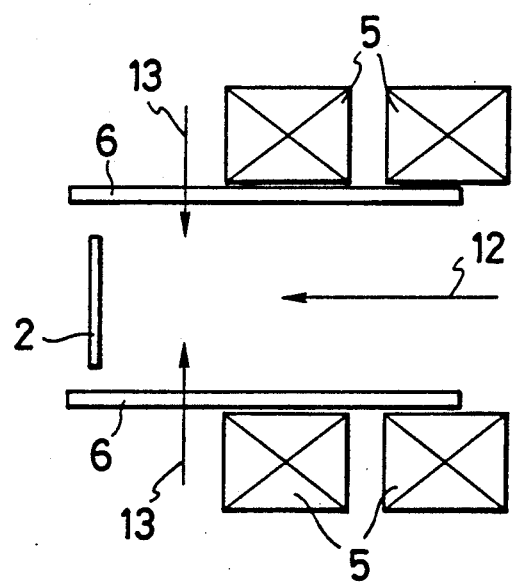
FIG. 7 is an explanatory view showing the drift forces excerted on plasma in accordance wit the present invention.

The relative location of the substrate 2 with respect to the Helmholtz coils 5 is very important. FIG. 5 shows the configuration of a conventional location. A number of curves have been drafted within the plasma generating space 1 to trace equi-strength surfaces of the magnetic field induced by the magnets 5 and 6. The magnetic field becomes stronger as the site departs from the center of the substrate 2. In this configuration, plasma experiences drift forces toward the weaker position, i.e. the direction leaving from the substrate 2. Namely, there is a tendency to gather plasma about the generating space 1 rather than the substrate surface to be processed. Generally speaking, the drift force exerted on plasma in a magnetic field is in proportion to -grad B, where B is the absolute strength of the magnetic field. The equi-strength surfaces in case of the present invention are shown in FIG. 6. The magnetic field becomes stronger at a nearer position to the substrate 2. The drifting force exerted on plasma is shown in FIG. 7 by arrows. The arrow 12 represents the drift force for drifting plasma toward the substrate 2 mainly induced by the Helmholtz coils 5. The arrows 13 represents a centripetal force which is induced mainly by the Ioffe bars 6.

Next, an exemplary method for depositing carbon films on a substrate by use of this apparatus is described. After evacuating the chamber by means of the evacuating system 9, hydrogen is admitted to the plasma generating space 1 at 10SCCM from the gas feeding system 11. The Helmholtz coils 5 are energized in order to induce a 2K Gauss magnetic field in the plasma generating space 1. The Ioffe bars 6 modify the magnetic field to produce a centripetal drift force. 2.45 GHz microwaves are inputted from the microwave generator 4 at 500 W. By virtue of resonance between the microwaves and hydrogen atoms and electrons, excited hydrogen ions and electrons are produced. The resonance may take place in an ECR mode, a MCR (Mixed Cyclotron Resonance) mode or the whistler mode. The pressure of hydrogen is maintained at 0.1 Pa. Hence, high hydrogen atoms or electrons collide with the surface of the substrate 2 and perform plasma cleaning.

After cleaning the substrate surface, the introduction of hydrogen is stopped and a carbon compound gas such as $CH_4$, $C_2H_4$, $C_2H_2$, $CH_3OH$ and $C_2H_5OH$ is introduced instead. The carbon compound gas is excited in the same manner as the hydrogen cleaning and deposits a carbon thin film of diamond or an i-carbon. In accordance with experiments, diamond films could be formed when the substrate temperature was not lower than 450° C. When the deposition was carried out in the same manner but without a magnetic field, only graphite films was formed.

the electron beam diffraction image of the thin carbon films deposited in accordance with the present invention was taken. In the image, spot patterns indicative of the existence of diamond structure were observed together with halo patterns which are peculiar to amorphous structure. This means that the carbon films were made of i-carbon. It was confirmed that i-carbon (diamond like carbon) films can be formed when the substrate is not heated. The diamond like carbon is an amorphous carbon, but has a high abrasion-proof surface and a high thermal conductivity. When the substrate temperature was elevated, the halo patterns gradually disappeared and, at not lower than 650° C., the thin films were confirmed to be diamond films.

The Raman spectrum of the film had a blunt peak about 1500 cm$^{-1}$ and a sharp peak about 1333 cm$^{-1}$ which indicates the existence of diamond.

While several embodiments have been specifically described, it is to be appreciated that the present invention is not limited to the particular examples described and that modifications and variations can be made without departure from the scope of the invention as defined by the append claims. Examples are described in below.

Improved silicon carbide films and aluminum nitride films can be formed in accordance with the present invention using methyl silane and gaseous aluminum compound and ammonia respectively. Also, tungsten, titanuim, molibdenum or their silicates having high melting points can be formed in the same manner.

The crystallinity of films in accordance with the present invention could be increased by adding water or oxygen into the reactive gas. Although the specific embodiment is explained concerning deposition, the present invention is applicable to general plasma processes in a magnetic field, such as plasma etching process and plasma cleaning process.

Optionally, a UV light source may be provided for exposing the reactive gas in the chamber in order to ensure the excited state of the reaction gas near the substrate to be processed. Also, a DC bias voltage may be applied to the reaction gas in plasma state. The bias can be applied by means of a voltage supply 14 connected between the substrate holder 3 and an electrode mesh 15 as illustrated if FIG. 1. The bias voltage is applied with the holder 3 being the cathode in case of Si deposition, and with the mesh 15 being the cathode in case of carbon deposition or etching using F$^-$ or B$^-$. In case of the holder made from a conductive material, the bias voltage consists only of a DC component. In case of the holder made from a non-conductive material, the bias voltage consists of a DC component and a superimposed AC component.

We claim:

1. A cyclotron resonance plasma processing method comprising:
   disposing a substrate in a reaction chamber;
   introducing a reactive gas into said reaction chamber;
   emitting microwaves into said reaction chamber;
   establishing a first magnetic field in said reaction chamber where the direction of the magnetic field is substantially parallel to the direction of propagation of the microwaves;
   producing a plasma gas by resonance between said reactive gas and the microwaves by virtue of said first magnetic field;
   establishing a second magnetic field in order to pinch said plasma near the substrate; and
   carrying out a plasma processing with said plasma gas on said substrate.

2. The method of claim 1, wherein the reactive gas includes a hydrocarbon gas so that a carbonaceous film is formed on said substrate by said plasma processing.

3. The method of claim 1 wherein the reactive gas includes a methyl silane gas so that silicon carbide is deposited on said substrate by virtue of said plasma processing.

4. The method of claim 1 wherein the reactive gas includes aluminum compound and ammonia gases so that aluminum nitride is deposited on said substrate by virtue of said plasma processing.

5. The method of claim 1 wherein said plasma processing is a plasma etching or a plasma cleaning.

* * * * *